United States Patent

Nyui et al.

[11] Patent Number: 6,004,187
[45] Date of Patent: Dec. 21, 1999

[54] METHOD AND APPARATUS FOR MEASURING FILM THICKNESS AND FILM THICKNESS DISTRIBUTION DURING POLISHING

[75] Inventors: Masaru Nyui, Utsunomiya; Mikichi Ban, Miura, both of Japan

[73] Assignee: Canon Kabushiki Kaisha, Tokyo, Japan

[21] Appl. No.: 08/917,853

[22] Filed: Aug. 27, 1997

[30] Foreign Application Priority Data

Aug. 30, 1996 [JP] Japan .................................. 8-248746

[51] Int. Cl.⁶ .............................. B24B 49/00; B24B 5/00
[52] U.S. Cl. ...................... 451/5; 451/6; 451/8; 451/285; 451/287; 451/288
[58] Field of Search ................................ 451/5, 6, 63, 8, 451/41, 42, 285, 286, 287, 288

[56] References Cited

U.S. PATENT DOCUMENTS

| | | |
|---|---|---|
| 5,081,796 | 1/1992 | Schultz . |
| 5,157,878 | 10/1992 | Hiyoshi et al. ............................... 451/5 |
| 5,361,547 | 11/1994 | Church et al. ................................ 451/5 |
| 5,486,129 | 1/1996 | Sandhu et al. . |
| 5,791,969 | 8/1998 | Lund ........................................... 451/5 |

FOREIGN PATENT DOCUMENTS

| | | |
|---|---|---|
| 0 266 728 | 5/1988 | European Pat. Off. . |
| 0 668 614 | 8/1995 | European Pat. Off. . |
| 6-252113 | 9/1994 | Japan . |

*Primary Examiner*—David A. Scherbel
*Assistant Examiner*—Philip J. Hoffmann
*Attorney, Agent, or Firm*—Fitzpatrick, Cella, Harper & Scinto

[57] ABSTRACT

Disclosed is a method of polishing the surface of a film provided on a substrate, by use of a polishing device, while relatively moving the film surface and the polishing device. The method includes a position detecting step for detecting a predetermined position on the surface of the film, a first measurement step for measuring an absolute value of the film thickness at the predetermined position, and a second measurement step for measuring film thickness information of the film about the predetermined position, on the basis of a measured value obtained through the first measurement step. The method also includes a film thickness distribution measurement step for detecting a film thickness distribution of the film, on the basis of a data obtained through the first and second measurement steps, and a control step for controlling continuation/discontinuation of polishing, on the basis of a data obtained through the film thickness distribution measurement step.

11 Claims, 11 Drawing Sheets

MEASURED VALUE OF 1ST MEASURING MEANS

MEASURED VALUE OF 2ND MEASURING MEANS

METHOD AND APPARATUS FOR MEASURING FILM THICKNESS AND FILM THICKNESS DISTRIBUTION DURING POLISHING

FIELD OF THE INVENTION AND RELATED ART

This invention relates to a polishing method and a polishing apparatus using the same, to be used in the process of semiconductor device production, for example, for chemically and mechanically polishing the surface of a substrate such as a wafer with accumulated dielectric material layer, for example, to provide a flat surface. The invention is particularly suitably applicable, for example, to a lithographic process by which, during a polishing process, completion of polishing of an insulating film layer (film layer) applied to a silicone substrate, for example, can be detected precisely such that the film thickness of the insulating film layer can be set efficiently within a predetermined range, thus enabling production of a semiconductor device of a large degree of integration.

With recent increases in the degree of integration of a semiconductor device, miniaturization of a circuit pattern as well as three-dimensional structure of the device have been advanced. If the numerical aperture of a projection optical system is enlarged to meet a higher degree of integration of a semiconductor device, the depth of focus of the projection optical system decreases. As a result, it is important to polish and flatten the surface of a semiconductor device to remove any surface step or irregularities thereon, such that a photoresist material can be applied to a flat surface and higher resolution of projection exposure can be accomplished.

Additionally, polishing an insulating film layer provided on a silicon substrate to produce a film layer of uniform thickness is an important factor to remove variation in capacity of different layers or to achieve constant depth of pier holes.

Conventionally, a chemical and mechanical polishing method has been proposed as a flattening procedure to remove surface steps and surface irregularities (protrusions and cavities) to provide a flat surface.

In such a chemical and mechanical polishing process, it is necessary to appropriately control the polishing rate, slurry density of polishing liquid, or temperature of the surface being polished. If the control is inaccurate, the insulating film provided on the silicon substrate may not have a predetermined thickness, or insufficient flattening may cause failure of assuring depth of focus or reduced reliability of wiring. Alternatively, dishing phenomenon or thinning phenomenon may occur due to a difference in polishing rate between an insulating film portion and an electrode wiring portion, or electric short between pier holes may result.

In consideration of the above, when the surface of a substrate such as a wafer having accumulated dielectric material layers is polished and flattened, it is important to correctly detect completion of polishing to assure that the surface is flattened without removing the material of underlying layer.

For example, during a chemical and mechanical polishing process, the thickness of a surface layer of a substrate such as a wafer having an accumulated layer of dielectric material may be monitored and the level of flattening over the whole surface of the substrate or a portion thereof may be detected to discriminate optimum timing of polishing completion. Conventionally, completion of polishing is detected by use of a method wherein the amount of polishing is detected on the basis of polishing time or a method wherein a change in polishing resistance is detected on the basis of a change in electric current of a polishing base table driving motor.

In the method in which the amount of polishing is detected on the basis of polishing time, it is necessary to control and keep constant the pressing force of a semiconductor device, wearing of the polishing pad, slurry density of the polishing liquid, or temperature of the surface being polished. It is therefore difficult to detect the completion exactly.

In the method in which a change in polishing resistance is detected from a change in electric current of a polishing base table driving motor, it is necessary to separate a signal waveform from a noise precisely. It is therefore difficult to detect the completion exactly.

SUMMARY OF THE INVENTION

It is accordingly an object of the present invention to provide a polishing method and/or apparatus by which, during chemical and mechanical polishing of a surface of a substrate such as a wafer having accumulated layers of dielectric material, for example, the film thickness can be monitored and overall or local film thickness distribution can be measured with suitable film thickness measuring method or means. From measurement information obtained, polishing conditions can be optimized and efficient polishing of a semiconductor device surface can be accomplished, and thus enhanced precision of detection of polishing completion can be attained.

In accordance with an aspect of the present invention, there is provided a method of polishing the surface of a film provided on a substrate, by use of polishing means, while relatively moving the film surface and the polishing means, said method comprising: a position detecting step for detecting a predetermined position on the surface of the film; a first measurement step for measuring an absolute value of the film thickness at the predetermined position; a second measurement step for measuring film thickness information of the film about the predetermined position, on the basis of a measured value obtained through said first measurement step; a film thickness distribution measurement step for detecting a film thickness distribution of the film, on the basis of data obtained through said first and second measurement steps; and a control step for controlling continuation/discontinuation of polishing, on the basis of data obtained through said film thickness distribution measurement step.

The film thickness information of the film at said second measurement step may include one of a film thickness difference and a film thickness average.

Said control step may include discontinuing the polishing when one of the film thickness of the film and the film thickness distribution of the film comes into a predetermined range.

Said first and second measurement steps, said film thickness distribution measurement step and said control step may be carried out during a process in which the surface of the film is polished by the polishing means.

A polishing pad of the polishing means may have an area which is narrower than the area of the surface of the film.

In accordance with another aspect of the present invention, there is provided a polishing apparatus for polishing the surface of a film provided on a substrate, by use of a polishing means, while relatively moving the film surface and the polishing means, said apparatus comprising:

position detecting means for detecting a predetermined position on the surface of the film; first measuring means for measuring an absolute value of the film thickness at the predetermined position; second measuring means for measuring film thickness information of the film about the predetermined position, on the basis of a measured value obtained through said first measuring means; film thickness distribution measuring means for detecting a film thickness distribution of the film, on the basis of data obtained through said first and second measuring means; and control means for controlling continuation/discontinuation of polishing, on the basis of data obtained through said film thickness distribution measuring means.

In this aspect of the present invention, the film thickness information of the film to be obtained with said second measuring means may include one of a film thickness difference and a film thickness average.

In this aspect of the present invention, said control means may discontinue the polishing when one of the film thickness of the film and the film thickness distribution of the film comes into a predetermined range.

In this aspect of the present invention, said first and second measuring means, said film thickness distribution measuring means and said control means may operate during a process in which the surface of the film is polished by the polishing means.

In this aspect of the present invention, said polishing means may have a polishing pad with an area narrower than the area of the surface of the film.

In this aspect of the present invention, said apparatus may comprise plural first measuring means and plural second measuring means, for executing measurements at different positions on the surface of the film.

In accordance with a further aspect of the present invention, there is provided a method of polishing the surface of a film provided on a movable substrate, by use of polishing means, while relatively moving the substrate and the polishing means, said method comprising: a light projecting step for projecting light to a predetermined position on the surface of the substrate, in synchronism with the movement speed of the film; a film thickness measurement step for detecting film thickness information of the film by use of light coming via the film; and a control step for controlling continuation/discontinuation of polishing, on the basis of the film thickness information obtained through said film thickness measurement step.

In accordance with a still further aspect of the present invention, there is provided a method of polishing the surface of a film provided on a movable substrate, by use of polishing means, while relatively moving the substrate and the polishing means, said method comprising: a position detecting step for detecting a predetermined position on the surface of the film; a light projecting step for projecting light to the predetermined position on the surface of the substrate, in synchronism with the movement speed of the film, on the basis of positional information obtained through said position detecting step; a film thickness measurement step for detecting film thickness information of the film by use of light coming via the film; and a control step for controlling continuation/discontinuation of polishing, on the basis of the film thickness information obtained through said film thickness measurement step.

In this aspect of the present invention, said control step may include discontinuing the polishing when one of the film thickness of the film and the film thickness distribution of the film comes into a predetermined range.

In this aspect of the present invention, said position detecting step, said light projecting step, said film thickness distribution measurement step and said control step may be carried out during a process in which the surface of the film is polished by the polishing means.

In this aspect of the present invention, a polishing pad of the polishing means may have an area which is narrower than the area of the surface of the film.

In accordance with yet a further aspect of the present invention, there is provided a polishing apparatus for polishing the surface of a film provided on a movable substrate, by use of polishing means, while relatively moving the substrate and the polishing means, said method comprising: position detecting means for detecting a predetermined position on the surface of the film; light projecting means for projecting light to the predetermined position on the surface of the substrate, in synchronism with the movement speed of the film; film thickness measuring means for detecting film thickness information of the film by use of light coming via the film; and control means for controlling continuation/discontinuation of polishing, on the basis of the film thickness information obtained through said film thickness measuring means.

In this aspect of the present invention, said control means may discontinue the polishing when one of the film thickness of the film and the film thickness distribution of the film comes into a predetermined range.

In this aspect of the present invention, said film thickness measuring means and said control means may operate during a process in which the surface of the film is polished by the polishing means.

In this aspect of the present invention, said polishing means may have a polishing pad with an area narrower than the area of the surface of the film.

In this aspect of the present invention, said apparatus may comprise plural film thickness measuring means, for executing measurements at different positions on the surface of the film.

In accordance with a still further aspect of the present invention, there is provided a method of polishing the surface of a film provided on a substrate, by use of polishing means, while relatively moving the film and the polishing means, said method comprising: a light projecting step for projecting light to a predetermined position on the surface of the film; an interference signal measurement step for measuring an interference signal based on an optical path difference between light reflected by the surface of the film and light passed through the film and reflected by the surface of the substrate; a selection step for selecting one of a wavelength of the light and an incidence angle of the light onto the film, on the basis of an interference signal obtained through said interference signal measurement step; and a control step for controlling continuation/discontinuation of polishing, on the basis of the amount of change in intensity of the interference signal obtained through said interference signal measurement step.

In this aspect of the present invention, said control step may include discontinuing the polishing when one of the film thickness of the film and the film thickness distribution of the film comes into a predetermined range.

In this aspect of the present invention, a polishing pad of the polishing means may have an area which is narrower than the area of the surface of the film.

In this aspect of the present invention, said light projecting step, said interference signal measurement step, said selection step and said control step may be carried out during a process in which the surface of the film is polished by the polishing means.

In accordance with a further aspect of the present invention, there is provided a polishing apparatus for polishing the surface of a film provided on a substrate, by use of polishing means, while relatively moving the film and the polishing means, said apparatus comprising: light projecting means for projecting light to a predetermined position on the surface of the film; interference signal measuring means for measuring an interference signal based on an optical path difference between light reflected by the surface of the film and light passed through the film and reflected by the surface of the substrate; selecting means for selecting one of a wavelength of the light and an incidence angle of the light onto the film, on the basis of an interference signal obtained through said interference signal measuring means; and control means for controlling continuation/discontinuation of polishing, on the basis of the amount of change in intensity of the interference signal obtained through said interference signal measuring means.

In this aspect of the present invention, said control means may discontinue the polishing when one of the film thickness of the film and the film thickness distribution of the film comes into a predetermined range.

In this aspect of the present invention, a polishing pad of the polishing means may have an area which is narrower than the area of the surface of the film.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
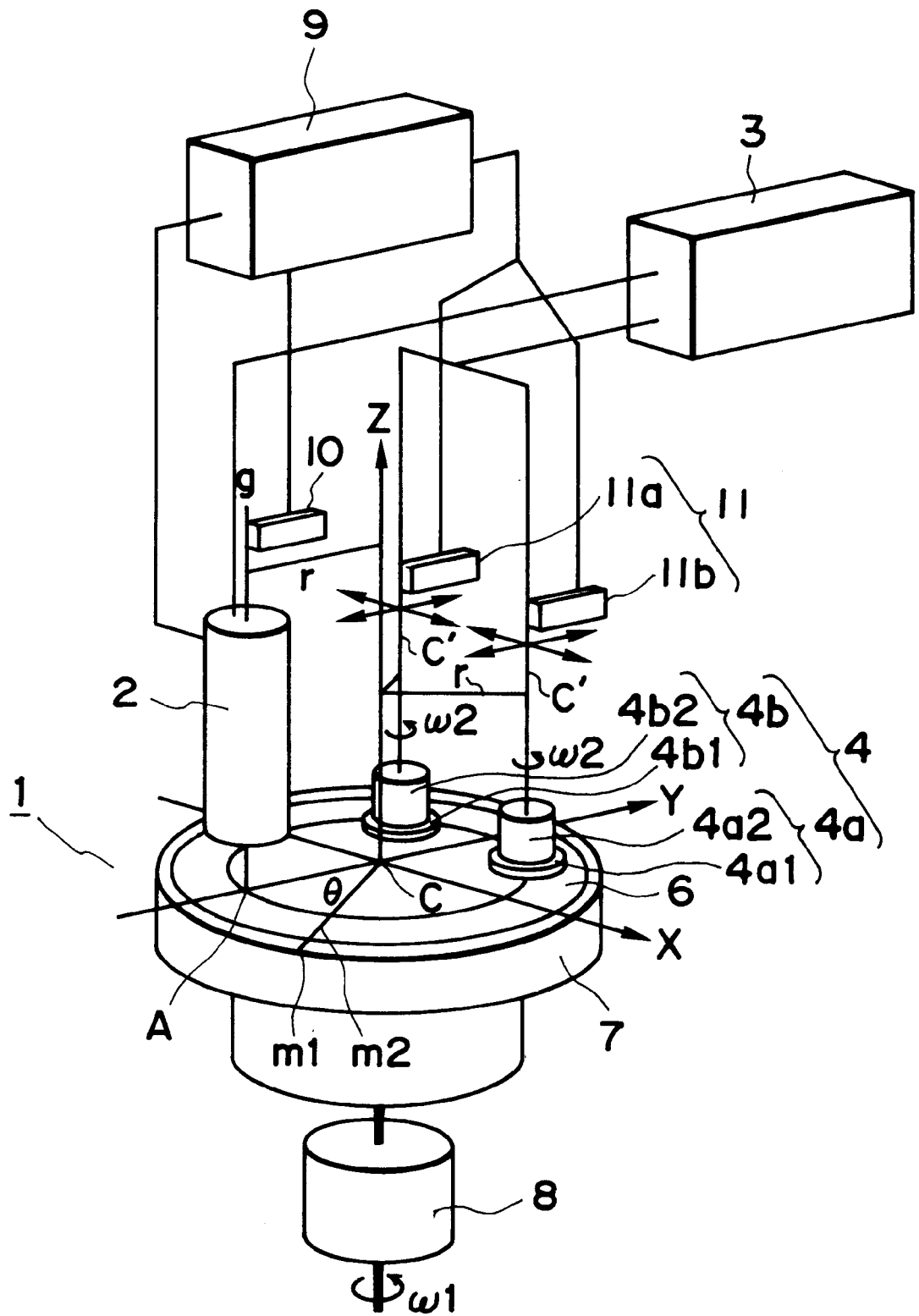
FIG. 1 is a schematic view of a main portion of a polishing apparatus according to a first embodiment of the present invention.

FIG. 1 is a schematic view of a polishing apparatus according to a first embodiment of the present invention, and it shows that an insulating film layer 5a of a substrate 5b (which is the material 6 to be treated) is being polished by polishing means 4.

Figure 2:
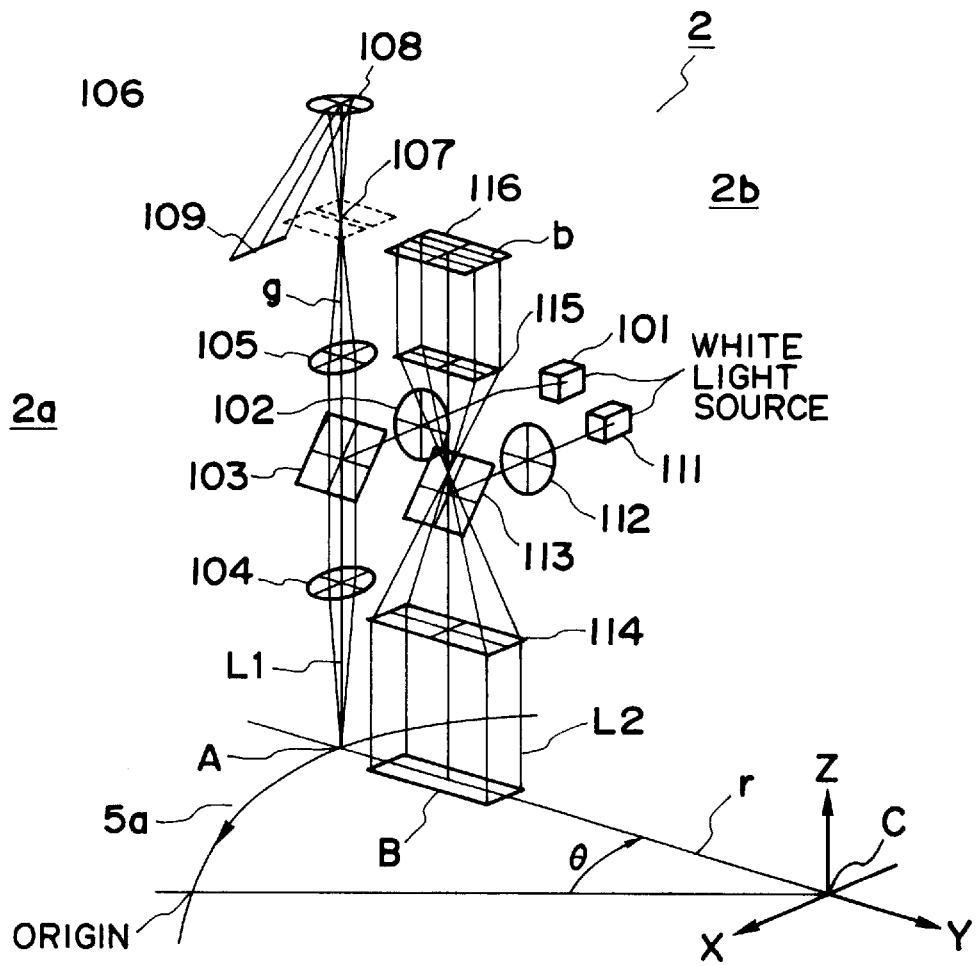
FIG. 2 is a schematic view of a main portion of film thickness measuring means, in the polishing apparatus according to the first embodiment of the present invention.

FIG. 2 is an enlarged view of film thickness measuring means 2 of the FIG. 1 embodiment. An absolute value of film thickness at a predetermined measurement position A, upon the insulating film surface 5a, is detected by it. By using the measured absolute value as a reference, film thickness differences in a predetermined region around the predetermined measurement position are measured.

Denoted in FIG. 1 at 1 is a chemically and mechanically polishing apparatus. In FIG. 1, the surface (substrate surface) of the article (workpiece) 6 to be treated is being polished by using two portion-polishing tools (polishing means) 4. The article 6 to be treated comprises a silicon substrate 5b on which an insulating film layer (film layer) 5a is formed. It is held by a substrate holder 7 which is adapted to hold the workpiece 6 and is rotated about a rotation axis C at an angular speed w1, by driving means (not shown).

In the drawing, the rotational axis C is taken on a Z axis, and a plane perpendicular to it is taken as an X-Y plane. Denoted at 8 is a rotary encoder for detecting rotational information of the rotational axis C. Denoted at 2 is film thickness measuring means having a structure such as shown in FIG. 2. More specifically, first film thickness measuring means 2a measures an absolute value of film thickness at a predetermined position A on the insulating film layer 5a, and second film thickness measuring means 2b measures film thickness information, such as film thickness difference, of a portion B around the predetermined position A, while taking the absolute value of the film thickness at the predetermined position A as a reference.

Denoted at 3 is control means for controlling the point of completion of polishing process for the workpiece 6 or continuation/discontinuation of the polishing process, on the basis of the result of detection of the surface information of the workpiece 6. Denoted at 4 (4a and 4b) is a portion polishing tool (polishing means). It comprises a polishing pad 4a1 and a holder 4a2 for holding the pad, and it is rotated about a rotational axis C' at an angular speed w2, by driving means (not shown).

In the drawing, there are two portion polishing tools 4a and 4b by which the insulating layer 5a on the silicon substrate 5b is polished locally. It is to be noted that two or more portion polishing tools may be used.

In this embodiment, as shown in the drawing, the polishing aperture of the polishing pad 4a1 is smaller than the surface (insulating film layer) 5a, of the workpiece 6, to be polished, such that the surface is polished locally. As shown in the drawing, each of the portion polishing tools 4a and 4b is placed at a predetermined distance from the Z axis in the X-axis direction, and it is movable along the X axis by a predetermined distance.

In this embodiment, a scrubber (not shown) is provided to remove slurry or the like adhered to the insulating film layer 5a when the film thickness is to be measured.

Also, a water nozzle (not shown) for supply of pure water is provided to discharge pure water over the workpiece surface (insulating film layer) 5a to remove slurry or foreign particles thereon, thereby to facilitate high precision detection of film thickness of the workpiece. Denoted at 9 is position detecting means for measuring positional information of the insulating film layer 5a. Denoted at 10 is a linear encoder, and denoted at 11 (11a and 11b) is a dual-axis linear encoder.

In this embodiment, for polishing the surface of the insulating film layer 5a, the polishing tool 4 is rotated about the rotational axis C' and, also, the substrate holder 7 is rotated about the rotational axis C, to cause relative motion between them. Also, as required, the relative position of them is changed with respect to the X and Y directions. While doing this, a slurry which contains polishing material is discharged from a nozzle (not shown) over the surface of the workpiece 6, whereby it is supplied uniformly to the interface between the insulating film layer 5a and the polishing pad.

Here, the pressure between the insulating film layer 5a and the polishing tool 4, the ratio of revolutions, and the amount of slurry supply are selected appropriately. With this procedure, the insulating film layer 5a formed on the silicon substrate 5b is polished by the polishing tool 4, and the surface is flattened.

After an elapse of predetermined time, the film thickness measuring means 2 shown in FIG. 2 is used to measure film thickness information (film thickness absolute value and film thickness relative value, for example) of the insulating film layer 5a, in the manner to be described.

In this embodiment, the film thickness information of the insulating film layer 5a of the workpiece 6 can be measured even during the polishing process. This effectively increases the throughput.

On the basis of an output signal of the film thickness measuring means 2, the control means 3 detects the overall film thickness and film thickness distribution of the insulating film layer 5a. Here, the control means 3 discriminates whether the film thickness and the film thickness distribution of the insulating film layer 5a are within predetermined ranges or not.

If the film thickness and the film thickness distribution are within predetermined ranges, the point of completion of polishing is concluded and the polishing process is discontinued. If not so, the polishing process is continued. If the control means 3 discriminates that the film thickness and the film thickness distribution of the insulating film layer 5a would not come into predetermined ranges during the polishing process (for example, a case where the thickness becomes too small due to over-polishing), the polishing process is discontinued. In that occasion, the workpiece 6 is discriminated as a defective article.

Detailed structure and operation of the preferred embodiments of the present invention will be described below.

[Embodiment 1]

First, a positional information detecting method (position detecting step) for detecting the position which is being measured by the film thickness measuring means 2, will be explained.

The predetermined position A can be detected as follows. When the substrate 5b is mounted on and held by the substrate holder 7, a reference mark m1 of the substrate holder 7 and a mark m2 formed on the substrate 5b are placed in alignment with each other. The position of the mark m1 corresponds to the position of an origin of the rotary encoder 8, coupled to the substrate holder 7.

The predetermined position A on the substrate 5b at which the film thickness is to be measured, is at an angle $\theta$ from that origin position and at a distance r from the rotational center C of the substrate 5b.

The position detecting means 9 detects this position A, and it controls the mechanism by using the linear encoder 10 so that a measurement reference axis g of the film thickness measuring means 2 comes to a position of distance r from the rotational center C of the substrate 5b.

Then, film thickness measurement is performed at a position where the output of the rotary encoder 8 becomes equal to $\theta$.

The film thickness measuring means 2 of this embodiment performs a first measurement step with first film thickness measuring means 2a, for measuring an absolute value of film thickness, and a second measurement step with second film thickness measuring means 2b, for measuring a relative value of film thickness difference of a portion around the absolute value film thickness portion, while taking the absolute value film thickness as a reference.

The manner of measurement of an absolute value of film thickness at a measurement position A through the first film thickness measuring means 2a, will first be explained.

As regards the film thickness measurement by the first film thickness measuring means 2a, for film thickness measurement the nozzle discharges pure water or the like over the insulating film layer 5a on the substrate (workpiece) 5b, to remove any slurry or foreign particles adhered to it. Then, film thickness measurement is performed.

The first film thickness measuring means 2a uses spectral reflectivity measurement method. White light emitted by a light source 101 goes via a condenser lens 102, a half mirror (HM) 103, and an objective lens 104, and it is collected and projected to a particular measurement position A, as measurement light L1.

Reflected light from the position A goes via the objective lens 104, the half mirror 103 and a lens 105, and it is imaged on a pinhole 107 of a spectroscope 106. The light passing through the pinhole 107 is resolved by a concave-surface diffraction grating 108 and is received by a one-dimensional sensor 109.

The output signal of the one-dimensional sensor 109 and the film thickness at that time are in the following relation.

If $\lambda 1$ and $\lambda 2$ denote the wavelengths as the change in interference intensity of two lights reflected by the surface of the insulating film layer 5a and reflected by the interface between the insulating layer 5a and the substrate 5b becomes maximum and minimum, respectively, n1 denotes the refractivity of the insulating film layer 5a, and $\phi1$ denotes the reflection angle at the above-described interface ($\phi1=0$ in this embodiment), then the film thickness d(A) at the position A is given by:

$$d(A)=1/(4\ n1\ \cos\ \phi1)(1/\lambda 2-1/\lambda 1)$$

The absolute value of film thickness d is determined by this.

The film thickness measuring means includes a plurality of first film thickness measuring means.

Next, the manner of measurement of film thickness difference of a portion around the measurement position A, by the second film thickness measuring means 2b, on the basis of the absolute value measured by the first film thickness measuring means.

As regards the film thickness measurement by the second film thickness measuring means 2b, a film thickness difference measurement region B is set, so as to measure a difference, from the absolute film thickness value at the position A, of a portion around the position A.

The second film thickness measuring means 2b comprises an optical system for projecting this film thickness difference measurement region B on to a color CCD 116 in a reduced scale. First, white light emitted by a light source 111 goes via a condenser lens 112, a half mirror (HM) 113, and an objective lens 114, and it is projected on the film thickness difference measurement region B as measurement light L2. Reflected light from the film thickness difference measurement region B goes via the objective lens 114, the half mirror (HM) 113 and a lens 115, and it is reduction-projected on the color CCD 116.

Figure 3:
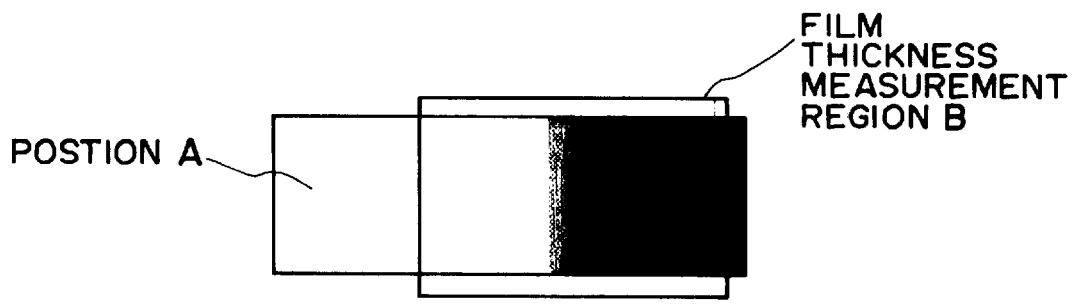
FIG. 3 is a schematic view for explaining film thickness difference as represented in terms of interference color distribution, in the film thickness measuring means of the polishing apparatus according to the first embodiment of the present invention.
Figure 3:
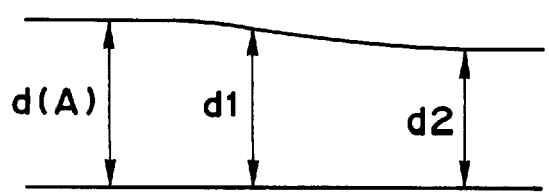

If the region thus illuminated is b, within this region b there is produced interference color corresponding to the film thickness difference with respect to the absolute film thickness d(A) at the position A, to be described below. In FIG. 3, wavelengths $\lambda A$ in the case of film thickness d(A), having an effect of mutually strengthening as a result of interference, can be specified in accordance with the following equation, and the interference color at the position A is determined.

$$2n\ Ad(A)=N\lambda A\ (N\ \text{is an integer})$$

If the interference color in the region b has a distribution which is expressed in terms of wavelength as $\lambda 1$ to $\lambda 2$, from comparison with the result of absolute film thickness value d(A) the distribution d1–d2 of film thickness difference within the region b can be calculated as follows:

$$d1=N\lambda 1/2n1$$

$$d2=N\lambda 2/2n2$$

As described, in this embodiment, there are plural first film thickness measuring means 2a and plural second film thickness measuring means 2b provided, to measure an absolute value of film thickness and film thickness differences whereby the film thickness distribution of the insulating film layer 5a as a whole of the substrate 5b is detected.

Next, the control of a polishing process in this embodiment will be explained.

As regards the control of polishing means and polishing condition, the dual-axis linear encoder 11 of the position detecting means 9 is used and the polishing means (portion polishing tool) 4 is moved to a position of a distance r from the Z axis. Here, the polishing means 4 is rotatable and also is swingable about X and Y axes.

On the basis of information from the first and second film thickness measuring means 2a and 2b, a difference with respect to a film thickness distribution to be finally attained is compared. If the difference is not within a predetermined range, the polishing condition is corrected in accordance with the amount of difference, and the polishing means 4 is controlled to execute the polishing again.

When the difference comes into the predetermined range, the polishing process is discontinued.

Figure 8:
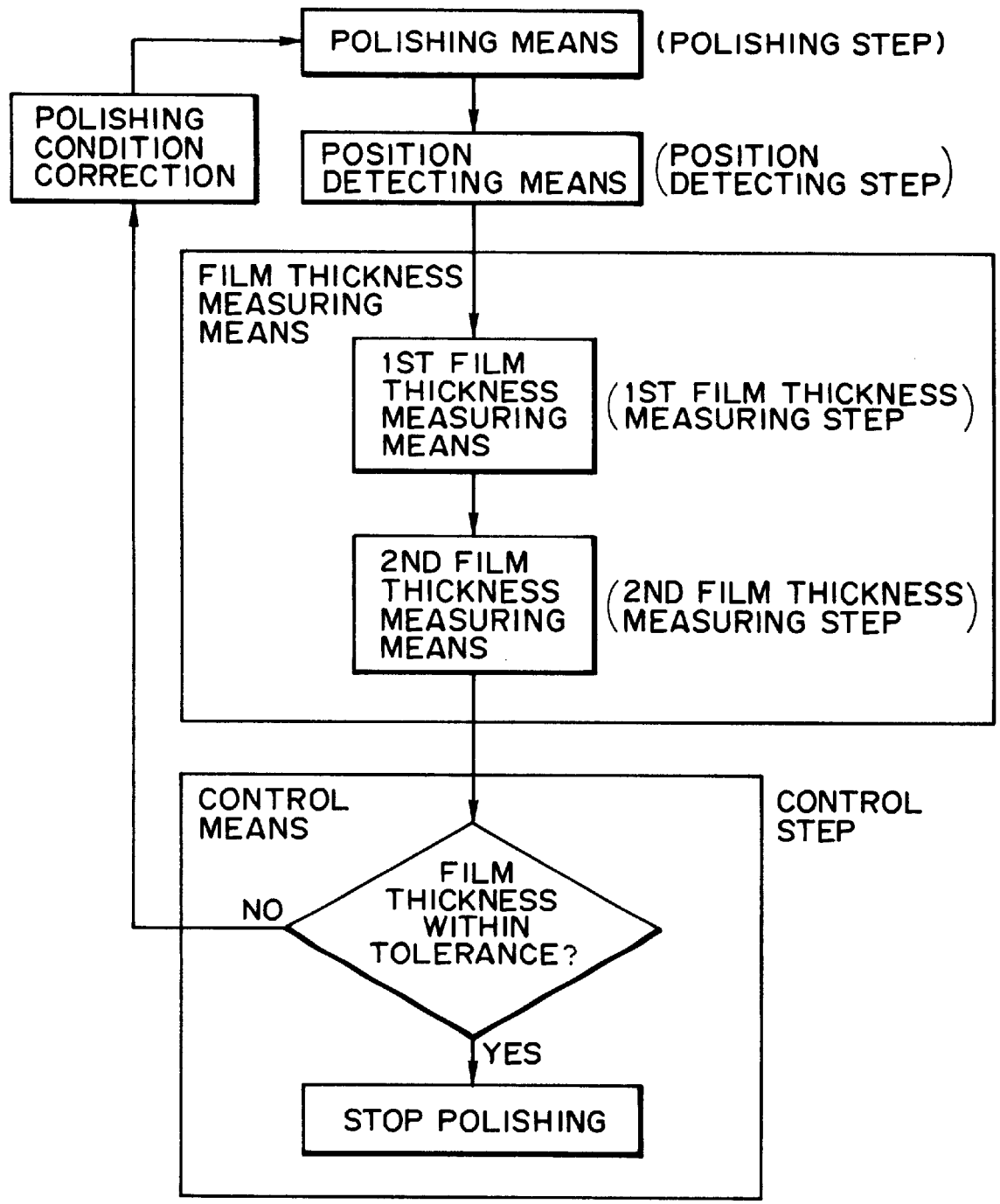
FIG. 8 is a flow chart for explaining the operation to be done in the first to third embodiments of the present invention.

FIG. 8 is a flow chart of operations of various components in this embodiment.

In accordance with this embodiment as described above, polishing means is used to polish and flatten the insulating film layer 5a of the silicon substrate 5b to assure that the whole region of the insulating film layer to be processed by the projection exposure is placed within the depth of focus of the projection optical system. Also, the film thickness of the insulating film layer 5a is controlled to be within a predetermined range, by which variation in capacity between different layers is prevented and constant depth of pier holes is assured.

[Embodiment 2]

Figure 4:
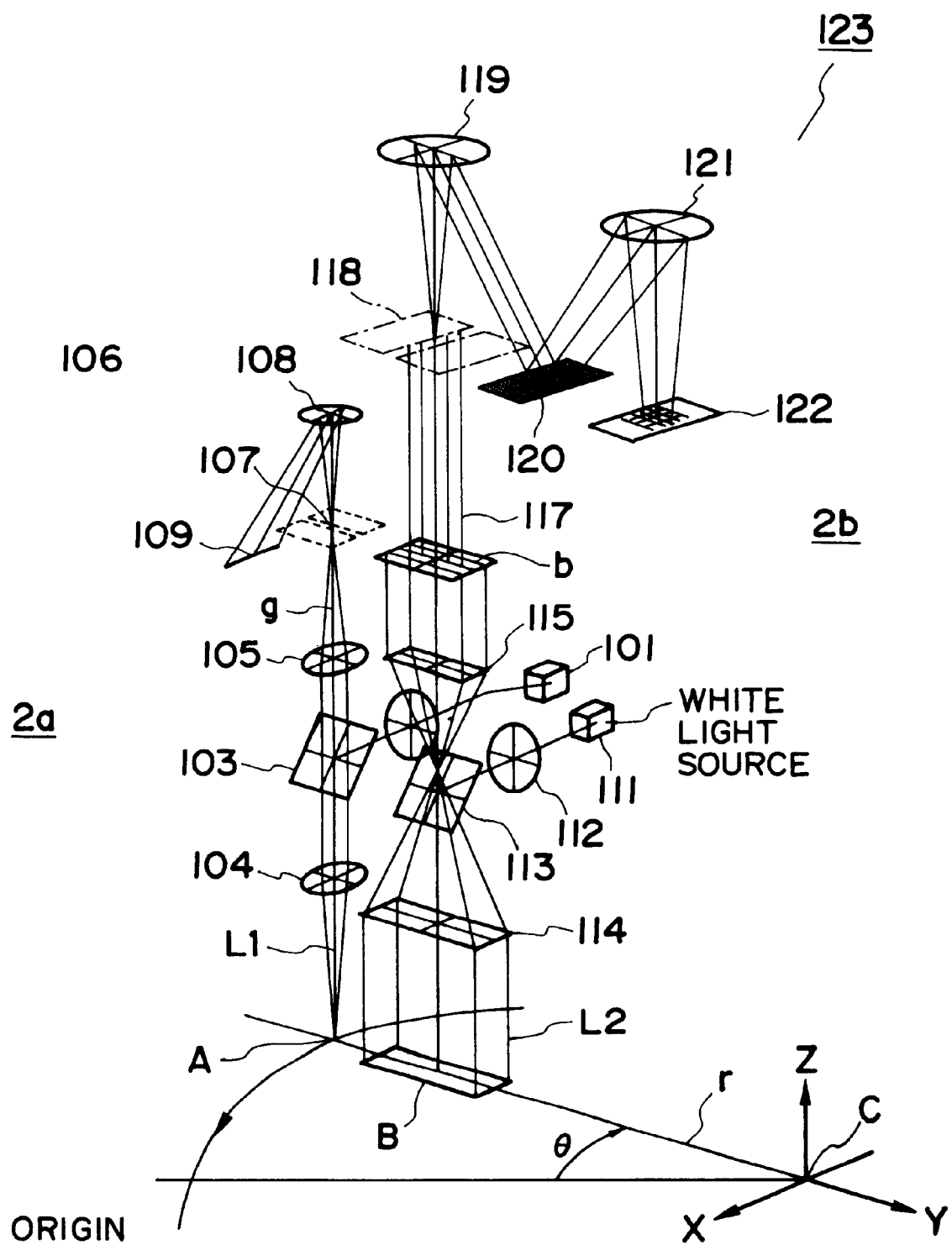
FIG. 4 is a schematic view of a main portion of a polishing apparatus according to a second embodiment of the present invention.

FIG. 4 is a schematic view of a main portion of film thickness measuring means 2 in a polishing apparatus according to a second embodiment of the present invention. The structure of this embodiment will be described below.

The position detection process in this embodiment is essentially the same as that in the first embodiment.

Figure 5A:
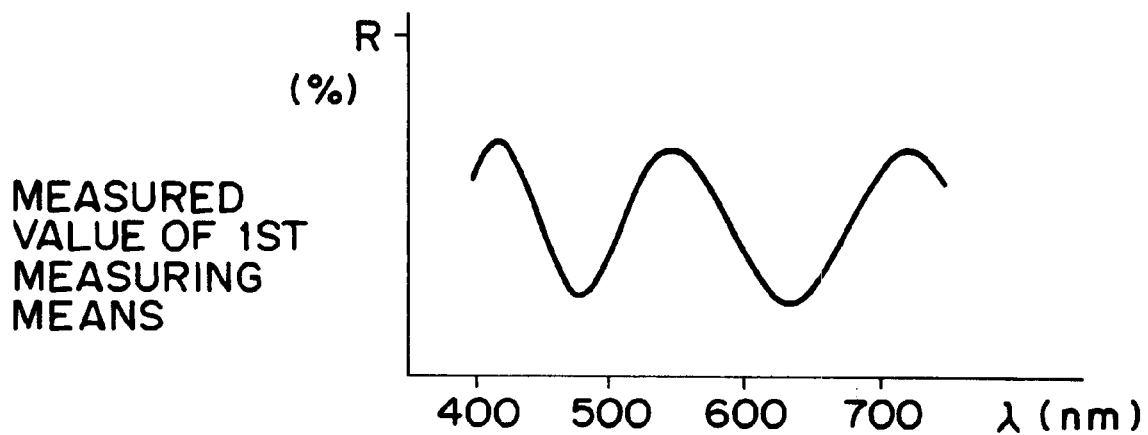
FIGS. 5A and 5B are graphs, respectively, for explaining a result of calculation of an average film thickness, obtained by averaging spectral reflectivities from different positions, in film thickness measuring means of the polishing apparatus according to the second embodiment of the present invention.

As regards the film thickness measurement process with the first film thickness measuring means 2a, it can be done in essentially the same way as that in the first embodiment. FIG. 5A shows spectral reflectivity as obtainable with the first film thickness measuring means 2a, in this embodiment.

As regards the film thickness measurement process with the second film thickness measuring means 2b, a film thickness average measurement region B is set, so as to measure a difference, from the absolute film thickness value at the position A, of a portion around the position A.

The second film thickness measuring means 2b comprises an optical system for projecting this film thickness average measurement region B on to the region b in reduced scale. First, white light emitted by a light source 111 goes via a condenser lens 112, a half mirror (HM) 113, and an objective lens 114, and it is projected on the film thickness average measurement region B of the insulating film layer as measurement light L2. Reflected light from the film thickness average measurement region B goes via the objective lens 114, the half mirror (HM) 113 and a lens 115, and it is reduction-projected on the region b.

Figure 5B:
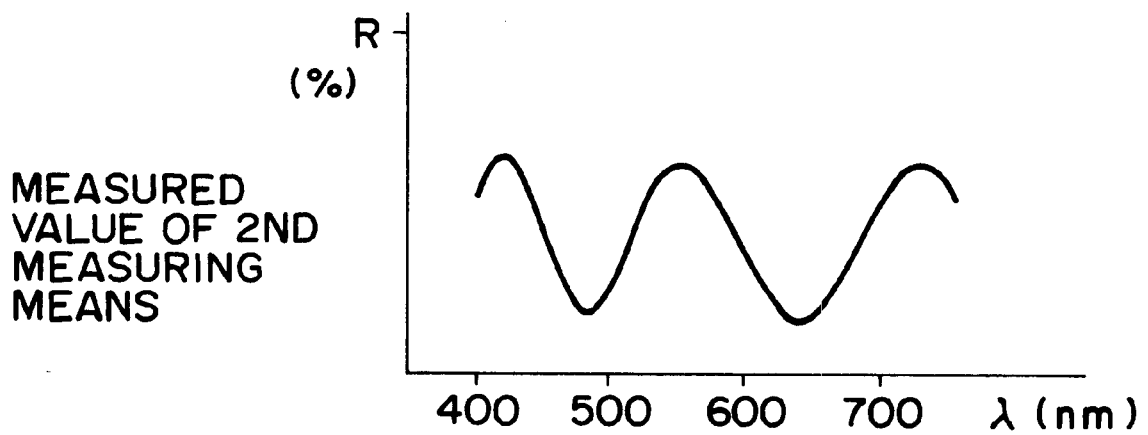

A plurality of fibers 117 are provided at different locations in the region b. Reflected light from finite areas at plural locations within the film thickness average measurement region B is directed to these fibers 117. The light goes via a slit 118, a reflection concave mirror 119, a grating 120, and a reflection concave mirror 121. By means of a spectroscope 123 having a two-dimensional sensor 122 such as a color CCD, an output of spectral reflectivity such as shown in FIG. 5B is produced as a result of averaging the finite areas at the different locations.

By using this and the spectral reflectivity of FIG. 5A, the film thickness distribution in the measurement region B is determined in a similar way as in the first embodiment.

In this embodiment of the present invention as described above, there are plural first film thickness measuring means and plural second film thickness measuring means provided, and an absolute value of film thickness and a film thickness average value are measured by which the film thickness distribution of the film layer as a whole of the substrate 5b is determined.

As regards the control of the polishing means and polishing condition, it may be made essentially the same manner as in the first embodiment. Also, the operation of this embodiment is substantially the same as that shown in the flow chart of FIG. 8.

[Embodiment 3]

Figure 6:
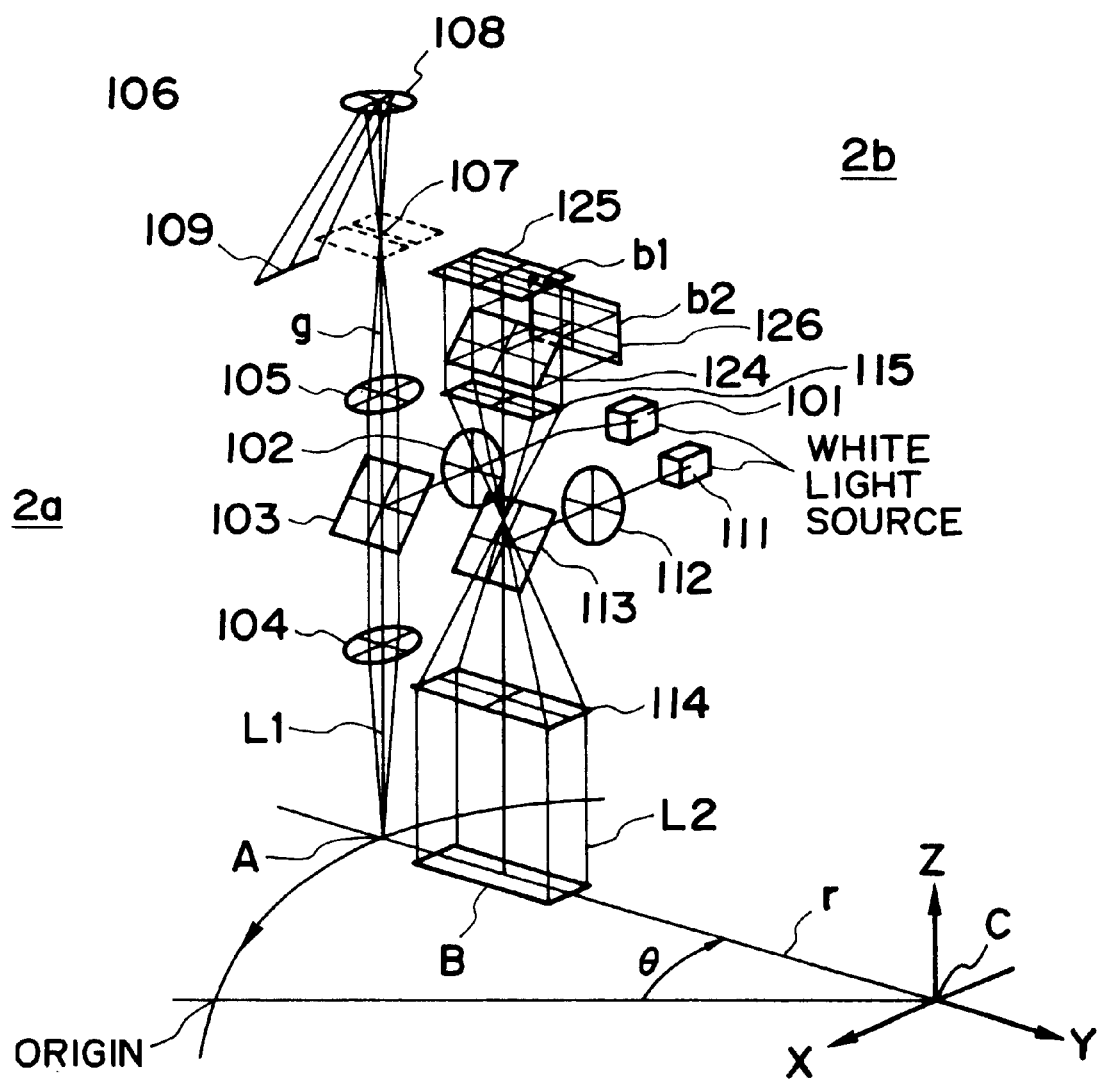
FIG. 6 is a schematic view of a main portion of a polishing apparatus according to a third embodiment of the present invention.

FIG. 6 is a schematic view of a main portion of film thickness measuring means 2 of a polishing apparatus according to a third embodiment of the present invention.

Figure 7A:
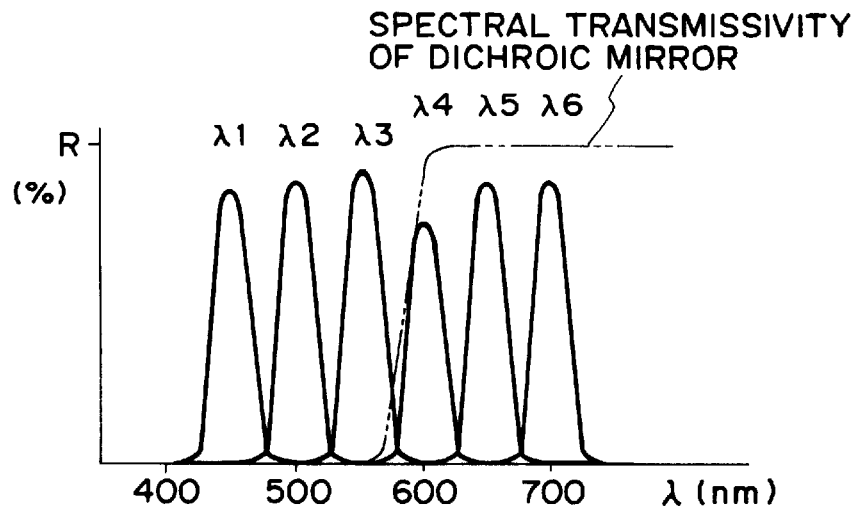
FIGS. 7A, 7B and 7C are graphs, respectively, for explaining a result of calculation of an average film thickness, obtained by detecting spectral reflectivity curve fitted, on the basis of reflectivities at sampling wavelengths from different positions, in film thickness measuring means of the polishing apparatus according to the third embodiment of the present invention.
Figure 7B:
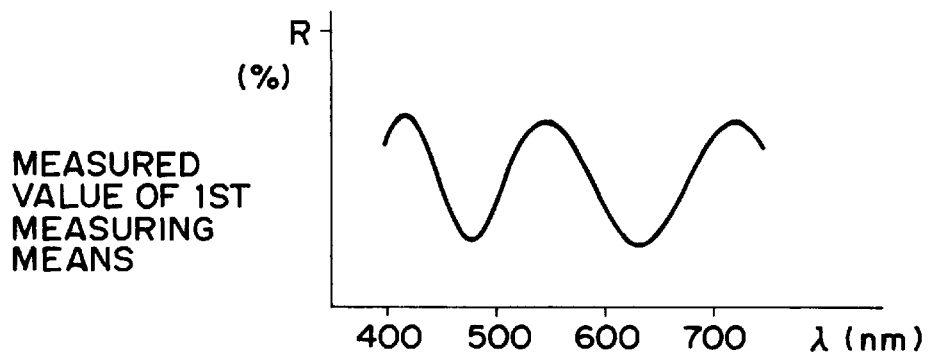
Figure 7C:
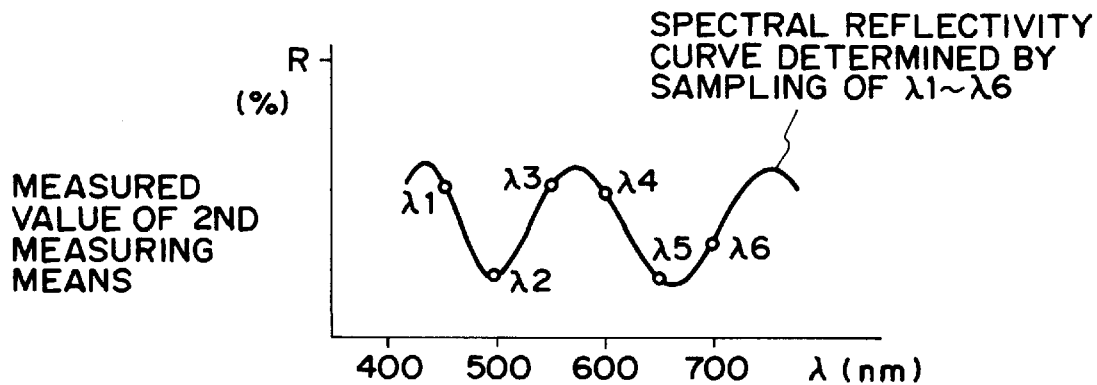

FIGS. 7A, 7B and 7C are graphs, respectively, for explaining spectral transmissivity of a filter used in the third embodiment as well as output signals from the first and second film thickness measuring means 2a and 2b of this embodiment. The structure of this embodiment will be explained below.

As regards the method of position detection, it is essentially the same as that of the first embodiment. Also, the film thickness measurement process with the first film thickness measuring means is substantially the same as that of the first embodiment.

As regards the film thickness measurement process with the second film thickness measuring means 2b, a film thickness average measurement region B is set, so as to measure a difference, from the absolute film thickness value at the position A, of a portion around the position A.

The second film thickness measuring means 2b comprises an optical system for projecting this film thickness average measurement region B on to color CCDs 125 and 126 in reduced scale. First, white light emitted by a light source 111 goes via a condenser lens 112, a half mirror (HM) 113, and an objective lens 114, and it is projected on the film thickness average measurement region B of the insulating film layer as measurement light L2. Reflected light from the film thickness average measurement region B goes via the objective lens 114, the half mirror (HM) 113, a lens 115, and a dichroic mirror 124, and it is reduction-projected on the color CCDs 125 and 126.

The regions thus illuminated are b1 and b2. The color CCDs 125 and 126 are provided with band-pass filters such as shown in FIG. 7A, for passing wavelengths $\lambda 1-\lambda 3$ and wavelengths $\lambda 4-\lambda 6$, respectively. With this structure, as shown in FIG. 7C the spectral reflectivity corresponding to the wavelengths $\lambda 1-\lambda 6$ contained in the reflected light from the whole film thickness average measurement region B can be measured.

Reflectivities corresponding to the wavelengths $\lambda 1-\lambda 6$ are then sampled and, while taking the absolute film thickness d(A) measured with the first measuring means 2a as a reference, a spectral reflectivity curve fitted to these sampling points is determined such as shown in FIG. 7B. The film thickness as can be calculated from this spectral reflectivity curve is determined as the film thickness of the region B.

In accordance with this embodiment of the present invention as described above, there are plural first film thickness measuring means and plural second film thickness measuring means provided, and an absolute value of film thickness and a film thickness average value are measured to thereby determine film thickness distribution of the whole substrate.

As regards the control of the polishing means and polishing condition, it is essentially the same as that in the first embodiment. The operation of this embodiment is also substantially the same as that shown in the flow chart of FIG. 8.

[Embodiment 4]

Figure 9:
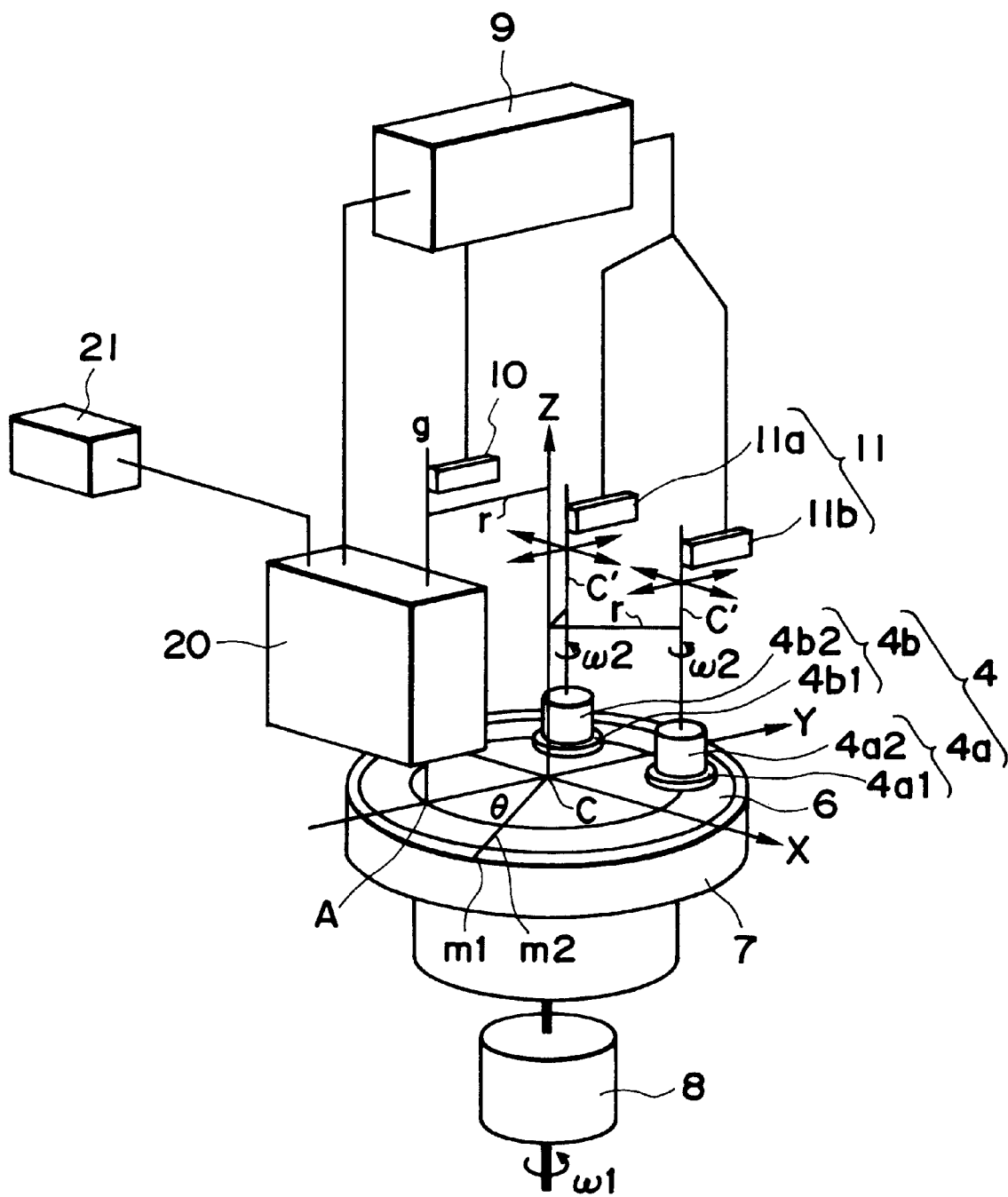
FIG. 9 is a schematic view of a main portion of a polishing apparatus according to a fourth embodiment of the present invention.
Figure 10:
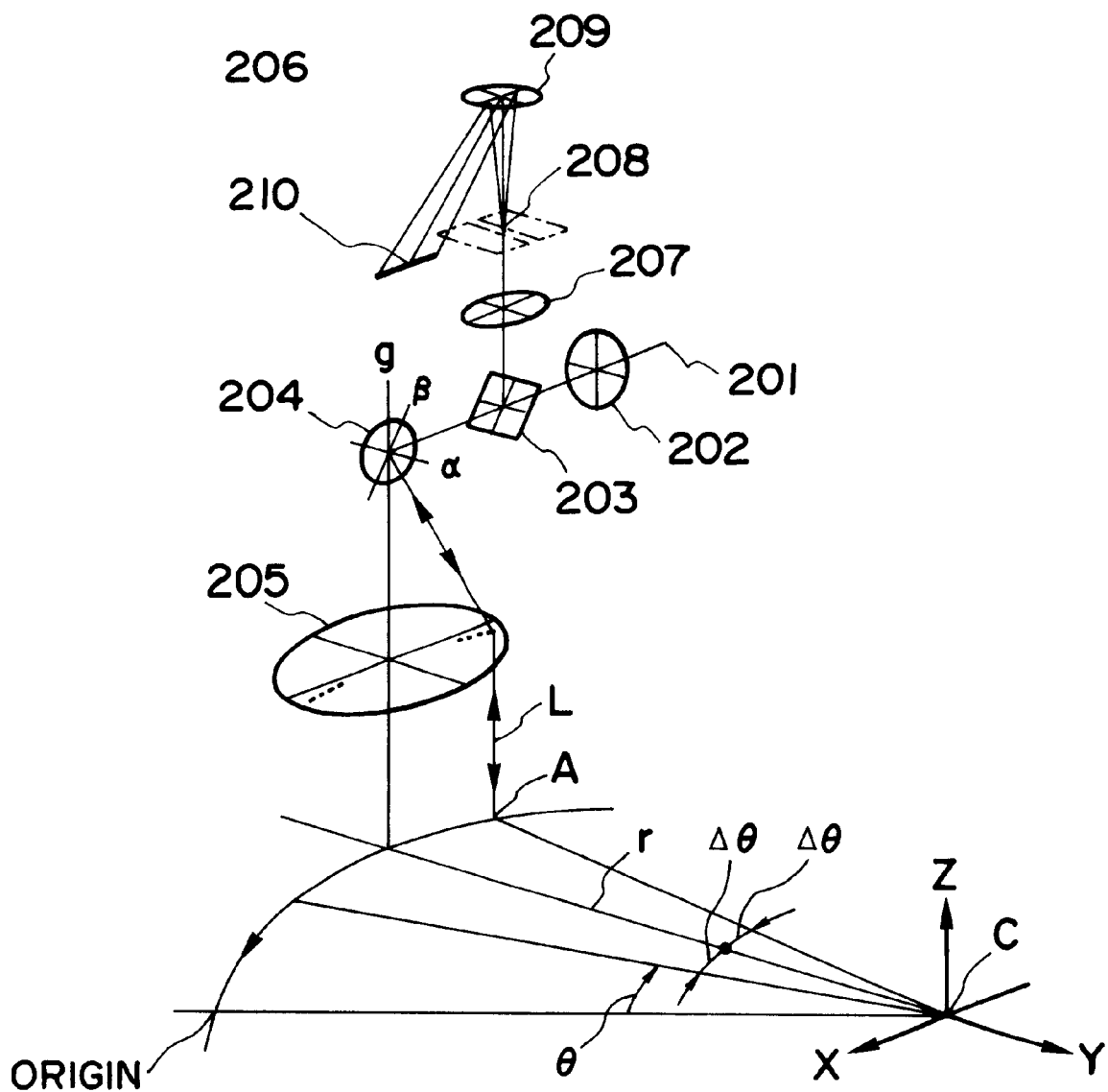
FIG. 10 is a schematic view of a main portion of film thickness measuring means of the polishing apparatus according to the fourth embodiment of the present invention.

FIG. 9 is a schematic view of a main portion of a polishing apparatus according to a fourth embodiment of the present invention. FIG. 10 is an enlarged view of film thickness measuring means 20 of the FIG. 9 embodiment. In FIG. 9, reference numerals similar to those of FIG. 1 are assigned to corresponding elements.

The film thickness measuring means 20 of this embodiment is arranged so that, for measurement of film thickness at a predetermined position A on an insulating film layer on the surface of a substrate being moved, measurement light to be projected on the position A is shifted in synchronism with the movement of the substrate 5b by use of light projecting means. This enables that the film thickness at the position A is measured directly (monitored) without stopping the substrate holder 7. In this point, the embodiment differs from the first embodiment of FIG. 1. The remaining portion of this embodiment is essentially of the same structure as of the first embodiment.

As regards the process of position detection, when the substrate 5b is mounted on and held by the substrate holder 7, a reference mark m1 of the reference holder 7 and a mark m2 formed on the substrate 5b are planed in alignment with each other. The position of this mark m1 corresponds to the position of an origin of the rotary encoder 8 coupled to the substrate holder 7.

The predetermined position A on the substrate 5b at which the film thickness is to be measured, is at an angle $\theta$ from that origin position and at a distance r from the rotational center C of the substrate 5b.

The position detecting means 9 detects this position A, and it controls the mechanism by using the linear encoder 10 so that a measurement reference axis g of the film thickness measuring means 20 comes to a position of distance r from the rotational center C of the substrate 5b.

The angular range with which the measurement light R from the film thickness measuring means 20 is to be synchronized with the measurement position A on the substrate 5b being moved is $2\Delta\theta$, and the output of the rotary encoder 8 detects an angular range from $\theta-\Delta\theta$ to $\theta+\Delta\theta$.

As regards the method of synchronization of the measurement position A and measurement light R as well as the method of film thickness measurement, for film thickness measurement the nozzle discharges pure water or the like over the insulating film layer 6a on the substrate 6b (workpiece 6), to remove any slurry or foreign particles adhered to it. Then, film thickness measurement is performed.

The film thickness measuring means 20 uses the spectral reflectivity measurement method. White light emitted by a light source 201 is transformed by a collimator lens 202 into parallel light and, after passing a half mirror (HM) 203, it is reflected by a dual-axis scan mirror 204 provided at a focus position of an objective lens 205 and is directed to the objective lens 205. These elements are components of light projecting means.

Here, the dual-axis scan mirror 204 controls angles about axis $\alpha$ and axis $\beta$ on the basis of positional information related to the position A as detected by the position detecting means 9, to assure that the measurement light L moves in synchronism with the position A being shifted.

During the period in which the position A moves through the range of angle $2\Delta\theta$, the reflected light from the position A goes back along its oncoming path and, after being reflected by the dual-axis scan mirror again, it goes via a half mirror lens 203 and a lens 207 of a spectroscope 206 and is imaged upon a pinhole 208. The light passing through the pinhole 208 is resolved by a concave-surface diffraction grating 209, and it is received by a one-dimensional sensor 210.

There is a relation such as follows between the output signal and the film thickness.

If λ1 and λ2 denote the wavelengths as the change in interference intensity of two lights reflected by the surface of the insulating film layer 5a and reflected by the interface between the insulating layer 5a and the substrate 5b becomes maximum and minimum, respectively, n1 denotes the refractivity of the insulating film layer 5a, and φ1 denotes the reflection angle at the above-described interface (φ1=0 in this embodiment), then the film thickness d(A) at the position A is given by:

$$d(A)=1/(4\ n1\ \cos\ \phi 1)(1/\lambda 2-1/\lambda 1)$$

The absolute value of film thickness d is determined by using the above equation, in this embodiment.

There are a plurality of film thickness measuring means 20 provided, and film thickness distribution of the film layer 5a provided on the substrate 5b is determined on the basis of plural film thickness values obtained through these plural film thickness measuring means.

As regards the control of polishing means and polishing condition, the dual-axis linear encoder 11 of the position detecting means 9 is used and the polishing means (portion polishing tool) 4 is moved to a position of distance r from the Z axis. Here, the polishing means 4 is rotatable and also is swingable about X and Y axes.

On the basis of information from the film thickness measuring means 20, a difference with respect to a film thickness distribution to be finally attained is compared. If the difference is not within a predetermined range, the polishing condition is corrected in accordance with the amount of difference, and the polishing means 4 is controlled to execute the polishing again.

When the difference comes into the predetermined range, the polishing process is discontinued.

Figure 11:
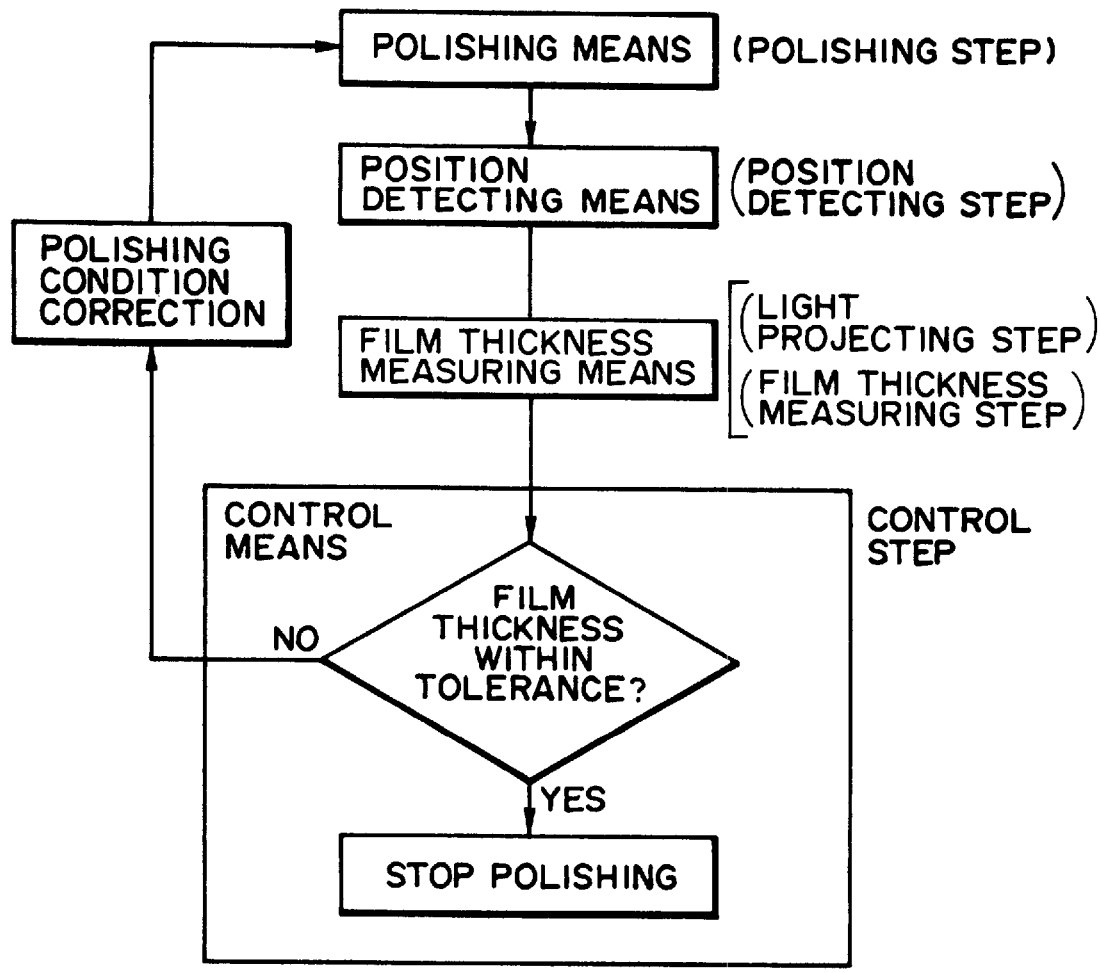
FIG. 11 is a flow chart for explaining the operation to be done in the polishing apparatus according to the fourth embodiment of the present invention.

FIG. 11 is a flow chart of operations of various components in this embodiment.

It is to be noted that the film thickness measuring method of this embodiment is applicable not only to measurement of the thickness of a film on the surface of a semiconductor device but also to measurement of the thickness of a film provided on the surface of any other substrate being moved.

[Embodiment 5]

Figure 12:
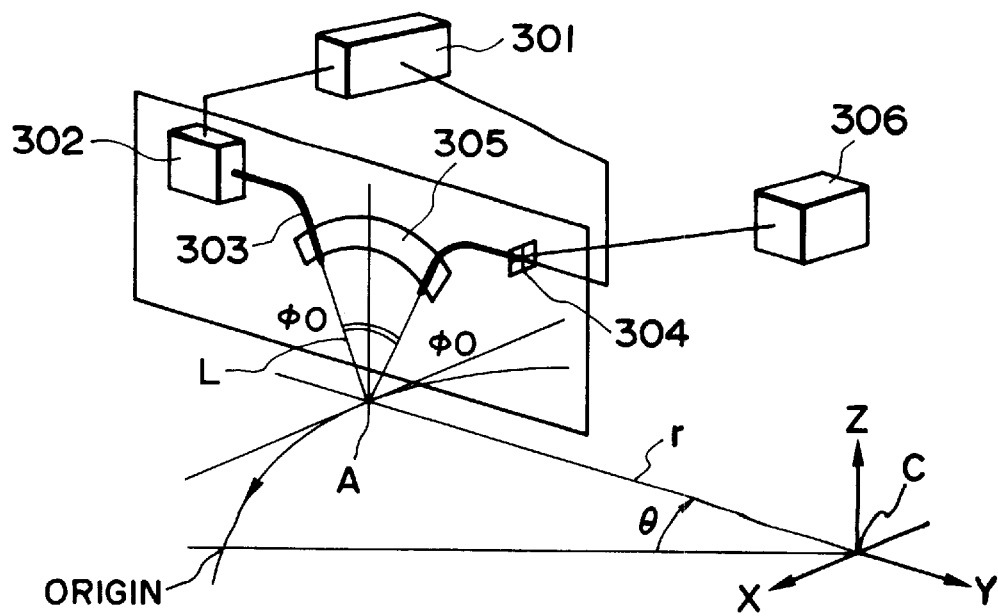
FIG. 12 is a schematic view of a main portion of film thickness measuring means of a polishing apparatus according to a fifth embodiment of the present invention.

Next, a polishing apparatus according to a fifth embodiment of the present invention will be described. The basic structure of the polishing apparatus of this embodiment is substantially the same as that of the first embodiment shown in FIG. 1. This embodiment differs from the first embodiment of FIG. 1 in the point of inside structure of the film thickness measuring means. FIG. 12 is a schematic view of a main portion of film thickness measuring means (interference signal measuring means) of this embodiment.

In the polishing apparatus of this embodiment, the surface of a film layer provided on a substrate is polished by polishing means while the film layer and the polishing means are being moved relative to each other. Interference signal measuring means (film thickness measuring means) has a sensor 304 and measures an interference signal which is based on a phase difference caused by an optical path difference between reflection light from the surface of the film at a measurement position and reflection light passed through the film and reflected by the surface of the substrate. In this measurement, wavelength/angle selection control means 301 in association with a monochrometer 302 and an incidence dangle changer 305 select measurement wavelength or incidence angle of measurement light to the film layer. At that time, by using a signal obtained with the sensor 304, control means 306 detects a portion where the amount of change in interference signal intensity becomes maximum. On the basis of the detection, discontinuation of polishing is discriminated.

As regards the process of detection of the position A, it is essentially the same as that of the first embodiment.

As regards the process of measurement of the interference signal, for the interference signal measurement the nozzle discharges pure water or the like over the insulating film layer 5a on the substrate (workpiece) 5b to remove any slurry or foreign particles adhered thereto. Then, measurement is performed.

Before the start of polishing, the film thickness is roughly controlled in the manufacturing processes. The value of film thickness at a measurement position A is here d(A). If it is necessary to measure this value exactly, before the start of polishing the film thickness measuring means such as in the first embodiment may be used to measure the film thickness.

Figure 13:
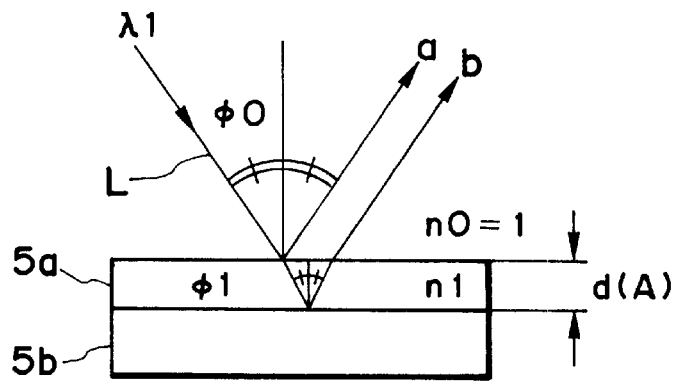
FIG. 13 is a schematic view for explaining the state of light, with interference signal measuring means of the polishing apparatus according to the fifth embodiment of the present invention.

The wavelength/incidence angle selection control means 301 shown in FIG. 12 of the measuring means sets the light to be emitted by the monochrometer to monochromatic light of wavelength λ1, such that measurement light L is projected via a fiber 303 to the insulating film layer 5a at the position A, with an incidence angle φ0 (light projecting step). Here, if as shown in FIG. 13 the refractivity of the insulating film layer 5a with respect to the wavelength λ1 is n1 and the reflection angle at the interface is φ1, then the intensity I of the interference signal produced by the sensor 304, on the basis of a phase difference due to optical path difference between reflection light a from the surface of the insulating film layer and reflection light b passed through the insulating film and reflected by the surface of the substrate, can be given by:

$$I = ua^2 + ub^2 + 2ua^2ub^2\cos(\sigma a - \sigma b)$$
$$= ua^2 + ub^2 + 2ua^2ub^2\cos\{(2\pi/\lambda 1)2n1d(A)\cos\phi 1\}$$

where sin φ0=n1 sin φ1, a=uae$^{i\sigma a}$, and b=ube$^{i\sigma b}$ (interference signal measuring step).

In this embodiment, on the basis of the above equation, the film thickness d(A) at the position A is detected by using the sensor 304 and the control means 306.

Here, the wavelength λ1 and incidence angle φ0 of the light emitted by the monochrometer may be selected as desired. However, those wavelength λ1 and incidence angle φ0 that satisfy the following relation may desirably be set:

$$(2\pi/\lambda 1)2n1d(A)\cos\ \phi 1=(2n+1/2)\pi(n=0, 1, 2, \dots)$$

With the arrangement described above, the precision of actual measurement of the film thickness amount Δd to be removed, by polishing, from the film thickness d(A) at the measurement position to a desired film thickness dt can be enhanced, as compared with a case where the wavelength λ1 and incidence angle φ0 are selected arbitrarily.

For measurement of the film thickness amount Δd to be removed by polishing, the signal output from the sensor 304 is analog-to-digital converted and, while performing level sampling with an interval corresponding to about one-twentieth of one period λ1/2n1 cos φ1 of the interference signal, the number of repetitions of the interference signal is measured.

Next, selection of wavelength and incidence angle for discontinuing the polishing, in the vicinity of a peak of the amount of change in interference signal intensity, will be explained.

Figure 14:
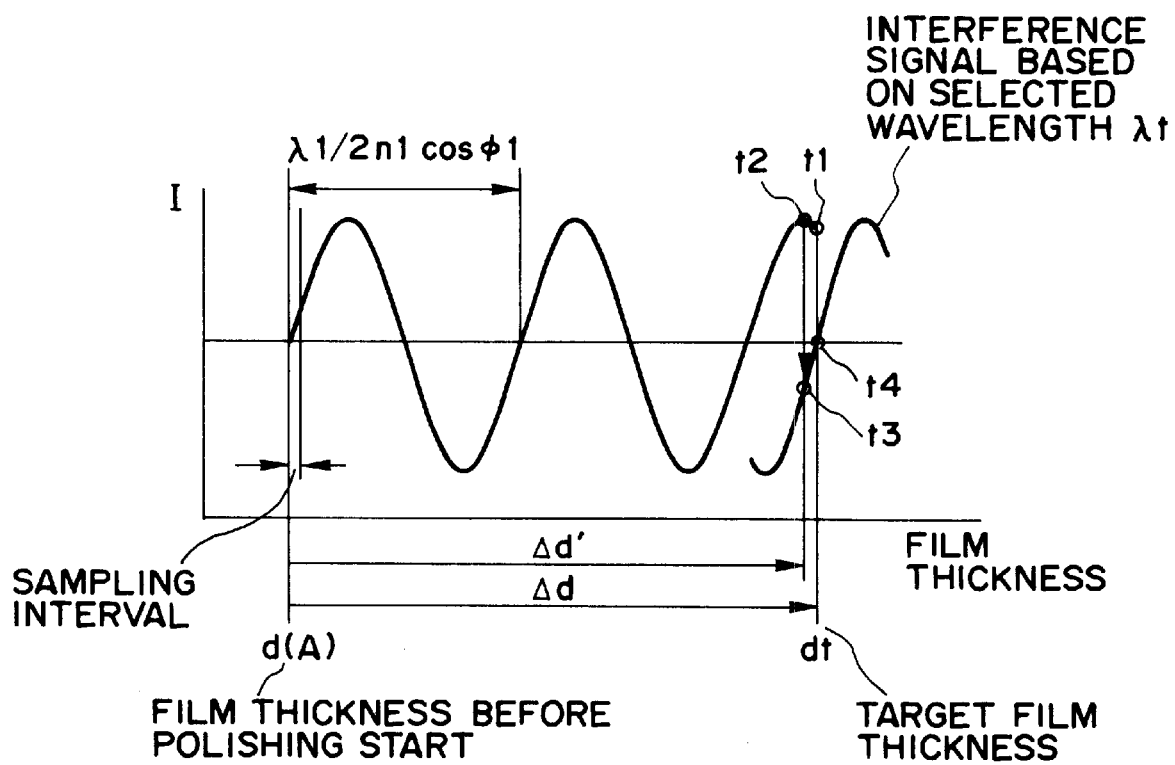
FIG. 14 is a graph for explaining selection of the wavelength or angle, for discontinuation of polishing, in the vicinity of maximum quantity of change in interference signal intensity, in the polishing apparatus according to the fifth embodiment of the present invention.

As shown in FIG. 14, the film thickness amount Δd as measured on the basis of the level sampling described above may be practically Δd', due to the precision of measurement (practically, the signal level at t1 may not be detected and the signal level at t2 mat be detected). This error of measurement will become notable when the position of the target film thickness dt is in a portion near the maximum or minimum intensity of the interference signal.

This error is corrected and final detection is performed in the state in which the amount of change in the interference signal intensity at the position of target film thickness dt becomes maximum, that is, the state in which the change in interference signal intensity is highly responsive to a change in film thickness.

When with the level sampling it is discriminated that the target film thickness dt is accomplished (practically, it may still be at Δd'), the wavelength λt is selected so as to satisfy the following relation (wavelength/incidence angle selecting step):

$$(2\pi/\lambda t)2ntdt \cos \phi 1 = (2m+1/2)\pi (m=0, 1, 2, \ldots )$$

While, with this wavelength change, in the control means 306 an interference signal intensity t3 is provided, the position of interference signal intensity t4 may be detected by level sampling and film thickness amount corresponding to a remaining difference between Δd and Δd' may be removed by polishing. Thus, high precision discrimination of discontinuation of polishing can be done (control step).

While in this example only the wavelength is changed, only the incidence angle or both of the wavelength and incidence angle may be changed to satisfy the above-described relation.

There are a plurality of interference signal measuring means provided.

In this embodiment of the present invention as described above, an interference signal based on a phase difference due to an optical path difference between reflection light from the surface of a film at a predetermined measurement position and reflection light passed through the film and reflected by the surface of the substrate, is measured. For this measurement, the measurement wavelength and/or the incidence angle of measurement light is selected, and discrimination of discontinuation of polishing is performed with good precision, in the vicinity of a portion in which the amount of change in interference signal intensity becomes maximum.

While the invention has been described with reference to the structures disclosed herein, it is not confined to the details set forth and this application is intended to cover such modifications or changes as may come within the purposes of the improvements or the scope of the following claims.

What is claimed is:

1. A method of polishing the surface of a film provided on a substrate, by use of polishing means, while relatively moving the film surface and the polishing means, said method comprising:

a position detecting step for detecting a predetermined position on the surface of the film;

a first measurement step for measuring an absolute value of the film thickness at the predetermined position;

a second measurement step for measuring film thickness information of the film about the predetermined position, on the basis of a measured value obtained through said first measurement step;

a film thickness distribution measurement step for detecting a film thickness distribution of the film, on the basis of data obtained through said first and second measurement steps; and a control step for controlling continuation/discontinuation of polishing, on the basis of data obtained through said film thickness distribution measurement step.

2. A method according to claim 1, wherein the film thickness information of the film at said second measurement step includes one of a film thickness difference and a film thickness average.

3. A method according to claim 1, wherein said control step includes discontinuing the polishing when one of the film thickness of the film and the film thickness distribution of the film comes into a predetermined range.

4. A method according to claim 1, wherein said first and second measurement steps, said film thickness distribution measurement step and said control step are carried out during a process in which the surface of the film is polished by the polishing means.

5. A method according to claim 1, wherein a polishing pad of the polishing means has an area which is narrower than the area of the surface of the film.

6. A polishing apparatus for polishing the surface of a film provided on a substrate, by use of polishing means, while relatively moving the film surface and the polishing means, said apparatus comprising:

position detecting means for detecting a predetermined position on the surface of the film;

first measuring means for measuring an absolute value of the film thickness at the predetermined position;

second measuring means for measuring film thickness information of the film about the predetermined position, on the basis of a measured value obtained through said first measuring means;

film thickness distribution measuring means for detecting a film thickness distribution of the film, on the basis of data obtained through said first and second measuring means; and control means for controlling continuation/discontinuation of polishing, on the basis of data obtained through said film thickness distribution measuring means.

7. An apparatus according to claim 6, wherein the film thickness information of the film to be obtained with said second measuring means includes one of a film thickness difference and a film thickness average.

8. An apparatus according to claim 6, wherein said control means discontinues the polishing when one of the film thickness of the film and the film thickness distribution of the film comes into a predetermined range.

9. An apparatus according to claim 6, wherein said first and second measuring means, said film thickness distribution measuring means and said control means operate during a process in which the surface of the film is polished by the polishing means.

10. An apparatus according to claim 6, wherein said polishing means has a polishing pad with an area narrower than the area of the surface of the film.

11. An apparatus according to claim 6, wherein said apparatus comprises plural first measuring means and plural second measuring means, for executing measurements at different positions on the surface of the film.

* * * * *

UNITED STATES PATENT AND TRADEMARK OFFICE
CERTIFICATE OF CORRECTION

PATENT NO. : 6,004,187

DATED : December 21, 1999

INVENTOR(S): MASARU NYUI, ET AL.

It is certified that error appears in the above-identified patent and that said Letters Patent is hereby corrected as shown below:

COLUMN 1:

Line 17, "silicone" should read --silicon--.

COLUMN 6:

Line 41, "chemically and mechanically" should read --chemical and mechanical--.
Line 49, "w1" should read --$\omega$1--.

COLUMN 7:

Line 4, ""w1" should read --$\omega$1--.

Signed and Sealed this

Twenty-fourth Day of April, 2001

Attest:

NICHOLAS P. GODICI

Attesting Officer

Acting Director of the United States Patent and Trademark Office